United States Patent
Kan

(10) Patent No.: US 8,427,184 B2
(45) Date of Patent: Apr. 23, 2013

(54) SCR MODULE DYNAMIC COUNTER TESTER

(75) Inventor: Dexter T Kan, Huntingtown, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 276 days.

(21) Appl. No.: 13/053,769

(22) Filed: Mar. 22, 2011

(65) Prior Publication Data

US 2012/0242361 A1   Sep. 27, 2012

(51) Int. Cl.
*G01R 31/20* (2006.01)

(52) U.S. Cl.
USPC .............. 324/754.11; 324/500; 324/754.08; 324/754.03; 361/42

(58) Field of Classification Search .................. None
See application file for complete search history.

(56) References Cited

U.S. PATENT DOCUMENTS 7,592,924 B2 * 9/2009 Zhang et al. .................. 340/638
7,652,946 B2 * 1/2010 Satoh ........................ 365/230.03

OTHER PUBLICATIONS

Kan, Dexter T., "F/A-18 Silicon Controlled Rectifier (SCR) Module Dynamic Counter Tester (DCT)", Jan. 2010.

* cited by examiner

*Primary Examiner* — Melissa Koval
*Assistant Examiner* — Trung Nguyen
(74) *Attorney, Agent, or Firm* — Mark O. Glut; Mark D. Kelly

(57) ABSTRACT

An SCR module tester facilitates rapid testing of SCR modules by a series of tests that are tailored to detect faults without applying full power to the modules. The SCR tester includes a quick clamp connector that is able to securely and easily clamp SCR modules for both the F/A-18 A/D GCU and F/A-18-E/F GCU facilitating the rapid testing of SCR modules.

9 Claims, 4 Drawing Sheets

SCR MODULE DYNAMIC COUNTER TESTER

GOVERNMENT INTEREST

The invention described herein may be manufactured, licensed, and used by or for the U.S. Government.

BACKGROUND

The Aircraft Engine Component Test Stand/Peculiar Support Equipment (AECTS/PSE) is a specially designed Intermediate Level (I-Level) instrument for testing Generator Converter Units (GCU's) used in the F/A-18 A-D and F/A-18 E/F. It is designed to test GCU systems as a whole without removing components. Because all GCU components remain connected during an AECTS/PSE test, and there are a limited number of test points, it can be difficult to pinpoint and correctly diagnose the source of a failure. GCU's that fail an AECTS/PSE test thus require laborious disassembly and component-by-component testing to determine which components may be defective. With 36 silicon controlled rectifier (SCR) channels on the F/A-18 A-D GCU and 54 on the F/A-18 E/F GCU, complete testing of all of the SCR modules in a GCU is very time consuming. Thus, there is a compelling need for a solid functional test apparatus that enables rapid and reliable testing of SCR modules for both F/A-18 A-D and F/A-18 E/F GCU's.

BRIEF DESCRIPTION OF THE DRAWINGS

Embodiments according to the invention are illustrated in the accompanying drawings in which like reference numerals represent like parts throughout and in which.

SUMMARY

Figure 1:
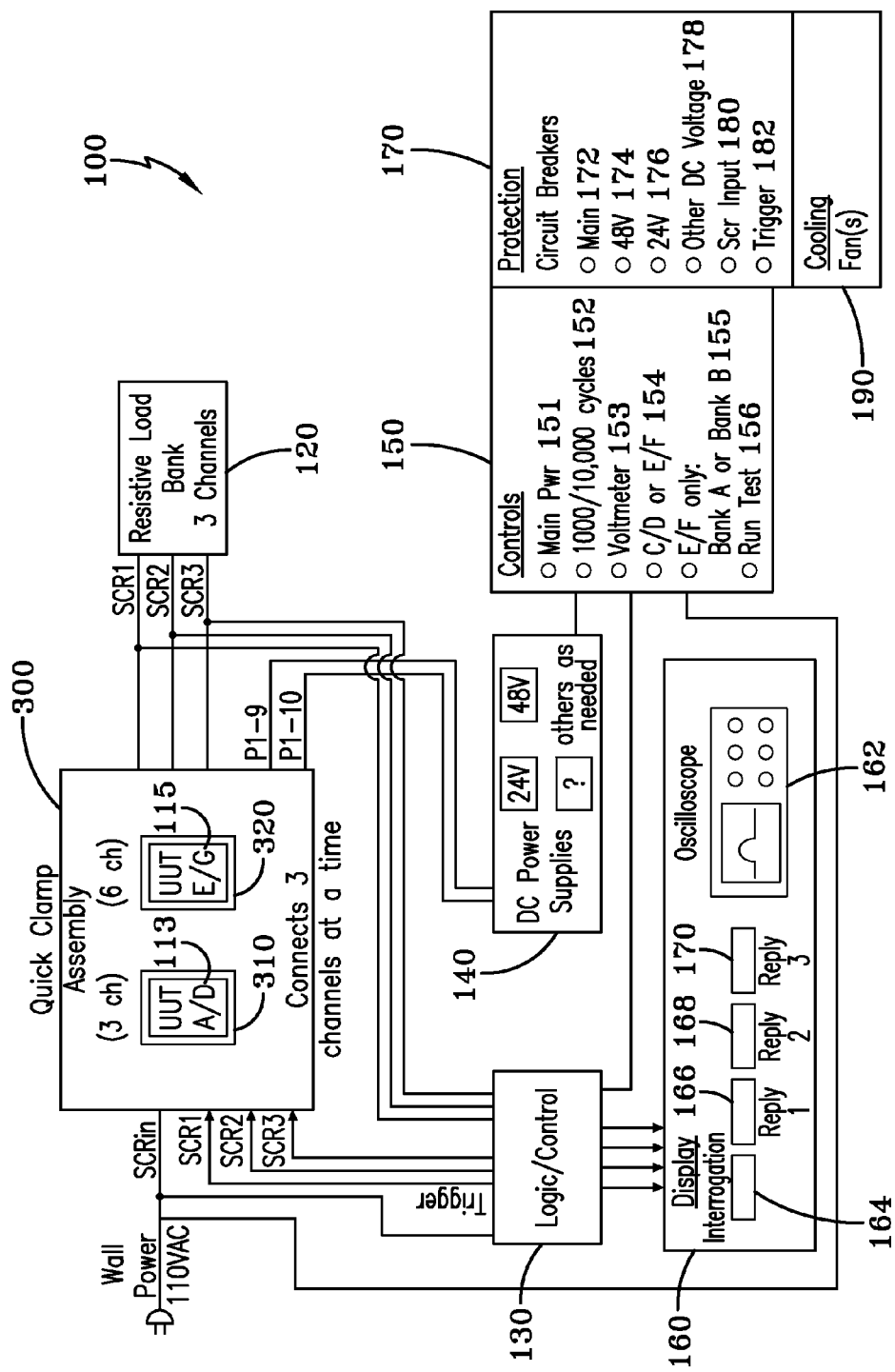
FIG. 1 shows a simplified structural block diagram of an embodiment of a Dynamic Counter Tester (DCT) in accordance with the disclosed subject matter.

In general, in one aspect, an embodiment of a silicon controlled rectifier module dynamic counter tester for testing a silicon controlled rectifier module for a generator control unit, the silicon controlled rectifier module including a control voltage input, a gate input, a source power input and a load power output, the apparatus for testing the SCR including a power source interruptably connected to the power source input of the silicon controlled rectifier module to be tested, a load interruptably connected to the load power output of the silicon controlled rectifier module to be tested, a control voltage power source interruptably connected to a control voltage input of the silicon controlled rectifier module to be tested, a test trigger voltage source interruptably connected to the silicon controlled rectifier module to be tested, a quick clamp assembly for releasably securing the silicon controlled rectifier module, the quick clamp assembly comprising a plurality of probes for making multiple interruptible connections to the silicon controlled rectifier module, a logic control module to perform logic/control and automated test functions for testing a silicon controlled rectifier module for a generator control unit, a display to show the results of tests performed by the apparatus, an overload protection module to prevent excess current from being drawn by the silicon controlled rectifier under test, a safety interlock device that automatically prevents operator electrical shocks, and an enclosure containing the apparatus for testing the silicon controlled rectifier module for a generator control unit.

In another aspect, the clamp assembly for securing the silicon controlled rectifier and making said interruptible test input power source connections is configured to connect to an SCR module for the generator control unit of an F-18 aircraft.

In yet another aspect, the logic control module of the SCR module counter tester according to the present invention is configured to provide a plurality of test cycles each test cycle comprising delivering an input voltage to the SCR under test followed by a plurality of trigger signal pulses to the SCR gate input after a zero crossing of the input voltage

DETAILED DESCRIPTION

In the following detailed description, reference is made to the accompanying drawings which are a part of this patent disclosure, and in which are shown by way of illustration specific embodiments in which the invention, as claimed, may be practiced. This invention may, however, be embodied in many different forms and should not be construed as limited to the embodiments set forth; rather, these embodiments are provided so that this disclosure will be thorough and complete, and will fully convey the scope of the invention to those skilled in the art. Unless otherwise defined, all technical and scientific terms used herein have the same meaning as commonly understood by one of ordinary skill in the art to which this invention belongs. Other features and advantages will be apparent from the following detailed description.

Embodiments of an SCR Module Dynamic Counter Tester (DCT) according to the present invention are designed to replicate the SCR Module interface for SCR's used in Generator Converter Units (GCU's) for the F/A-18 A-D and F/A-18 E/F/G, testing one module at a time. The DCT electrically isolates the SCR Module being tested and provides a series of dynamic tests designed to detect intermittent failures as well as open circuit and short circuit faults. The system performs tests at relatively low current levels without approaching device rated limits, assuring that it will not induce damage.

A prototype DCT has proven to be 93% accurate in pass/fail determination without testing the full dynamic range, a strong improvement over the AECTS/PSE's 20% accuracy rate. Alternative embodiments of a DCT according to the present invention may be equipped to provide a high current load to cause an SCR under test to heat to the point of heat related failure modes. In alternative embodiments, a DCT according to the present invention may be equipped with a heating device such as a silicone heat blanket or another source of radiant heat, for example, a heat lamp, to heat the SCR under test to a point where heat related failure modes are known to occur. Because only a limited number of failures occur near the thermal limits of the SCR's and heat testing takes additional time, in many applications, the tradeoff for speed over increased accuracy beyond 93% is reasonable, especially given the operational environment at Intermediate and Depot level GCU maintenance facilities. When non-heating embodiments of the DCT are used in conjunction with the AECTS/PSE in accordance with procedures, the overall accuracy rate in determining SCR Module pass/fail will be 96% to 97%. As a pretest that compliments the tests performed by the AECTS/PSE this is more than adequate.

FIG. 1 shows a simplified block diagram of an embodiment of a DCT 100 in accordance with the present invention. DCT 100 includes a quick clamp assembly 300, a logic control module 130, a resistive load bank 120, a power supply module 140, cooling fans 190, a control module 150, an overload protection module 170, a display 160 and a housing or enclosure (not illustrated). Each SCR module to be tested includes a number of inputs and outputs, including, control power inputs, gate or trigger inputs, source power inputs and power outputs. The ability to make reliable, repeatable electrical contact with the inputs and outputs of SCR modules to be tested is extremely important for reliable testing. It is also important to be able to quickly test SCR modules. Thus, DCT 100 preferably includes a quick clamp assembly 300, shown in a perspective view in FIG. 3 to provide an easy-to-use interface for rapidly and repeatedly making multiple secure electrical connections to SCR Modules under test in a single motion without having to attach each probe individually to a unit under test.

Quick clamp assembly 300 includes a base plate 322 on which are mounted dual SCR clamping mechanisms, a three channel clamp mechanism 310 for releasably securing a three channel F-18 A/D SCR module 113, and a six channel clamp mechanism 320 for releasably securing a 6 channel F-18 E/F/G SCR module 115. (SCR modules 113, 115 are not shown in FIG. 3). Each clamp mechanism 310, 320, includes a horizontal top member 312 secured to a pair of vertical guide shafts 315 that extend down to a common base plate 322 in which they are secured.

Clamp mechanism 310, 320 also each include a clamping head 311, 321 that provides multiple probes 318 that are positioned to engage contacts located on the top face of the respective SCR to be tested. To enable connection of multiple probes in a single motion, clamping heads 311, 321 have through holes permitting them to slide on vertical guide shafts 315 from an up (unclamped) position to a down (clamped) position.

Figure 3:
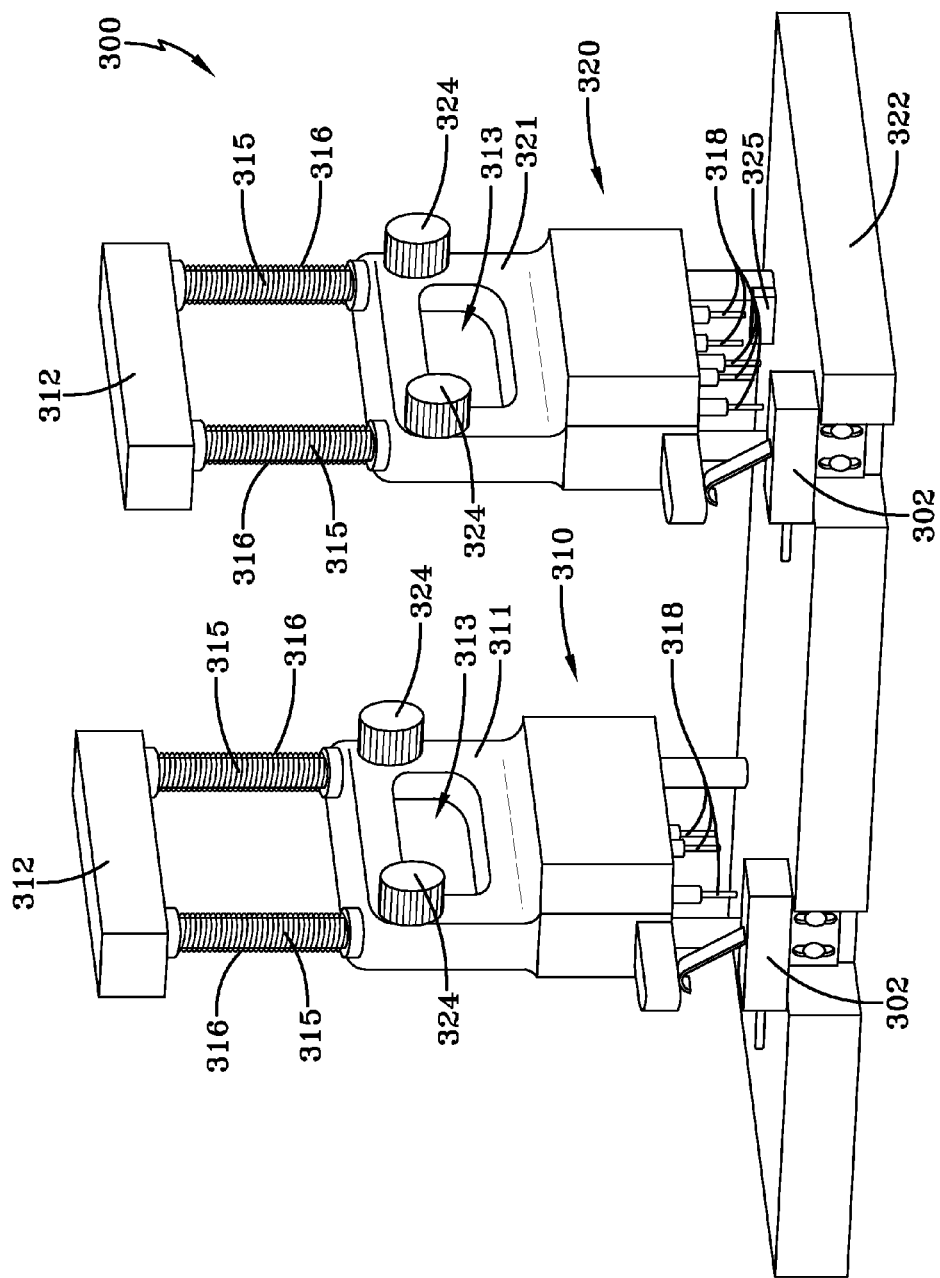
FIG. 3 shows an isometric view of a prototype quick clamp connector for SCR modules to be tested by a DCT in accordance with the disclosed subject matter.

As shown in FIG. 3, probes 318 are preferably spring loaded contact pins which are selected to ensure that secure electrical connection is made at each contact of the SCR to be tested. Tensioning springs 316 are located on each of the verticals shafts 315 above clamping heads 311, 321 and serve to bias the clamping heads 311, 321 downwardly so that probes 318 securely engage their respective contacts on the SCRs under test.

Clamping heads 311, 321 have hand holes 313 that allow the claiming heads 311, 321 to be grasped and drawn up toward horizontal top members 312 thus enabling one handed operation while the other hand may be used to remove and insert SCR's to be tested. Each clamping head 311, 321, further includes retaining fasteners 324 for each vertical guide shaft 315 to secure the clamping heads 311, 321, in the up (unclamped) position. In FIG. 3 the retaining fasteners 324 are knurled screws that may be tightened against the vertical shafts 315. In alternative embodiments, retaining fasteners 324 may include one or more spring-biased pins, keys or balls that engage corresponding detents on shafts 315 to hold clamping heads 311, 321, in an unclamped position.

Quick clamp assembly 300 also includes one or more safety interlock devices 302 to protect users from electrical shocks. Safety interlock devices 302 serve to automatically interrupt mains power to clamp mechanisms 310, 320, whenever clamp mechanisms 310, 320, are not properly in the down (clamped) position. In FIG. 3 safety interlock devices 302, are single-pole single-throw switches for each clamping mechanism 310, 320 that are automatically thrown when clamping heads 311, 321 are fully in the down (clamped) position. In alternative embodiments, safety interlock devices may include switches and/or sensors located adjacent to or on clamp mechanisms 310, 320 which may actuate mechanically, magnetically or optically. In further alternative embodiments, one or more additional safety switches and/or sensors may be positioned on base plate 322 underneath clamping heads 311, 321 to interrupt power whenever an SCR to be tested is not properly in position.

Referring again to FIG. 1, input power SCRIN is connected through quick clamp assembly 300 to the input power channels of SCR modules 113, 115, under test. Similarly, a resistive load bank 120 is connected to the output power channels of SCR modules 113, 115, under test via quick clamp assembly 300. Resistive load bank 120 preferably provides three channels. Thus, six channel SCRs 115 are tested three channels at a time. Connections to SCRIN, SCR1, SCR2 and SCR3 are made through probes 318 which are positioned in 3 channel clamp mechanism 310 above the respective contact points on SCR module 113. Likewise, connections to the six SCR channels of SCR 115 are made through the 6 channel clamp mechanism 320 above contact points on SCR module 115. As noted, spring loaded electrical contact pins are preferably used for the probes 318 in clamp mechanism 310 and 320.

While the in-service GCU voltage may reach 200 volts RMS, and current loads may reach as much as 60 amps, it has been determined that 110 VAC at 2.4 amps is generally sufficient for testing functionality of the SCR Modules. Resistive load bank 120 provides for a load current of 2.4 amps at line voltage (110 VAC) through each channel of SCR Modules 113 and 115. Cooling fans or other cooling devices such as peltier elements should be provided in the housing for DCT 100 to ensure that resistive elements of resistive load bank 120 do not overheat.

The control functions of GCU SCR modules 113 and 115 utilize 24 VDC and 48 VDC. A power supply 140 provides the 24 VDC and 48 VDC control power for the SCR modules. A control voltage connector 325 is provided with quick clamp assembly 300 to supply control voltages (P1-9, P1-10 and GND) to SCR modules under test. As shown in FIG. 3, control voltage connector 325 (a 10 pin DIN) is mounted to base plate 322 beneath clamping head 321 for making control voltage connections to 3 channel SCR modules 113. An external connector (not illustrated) is provided for control voltage connections to 6 channel SCR modules 115.

A number of circuit breakers are provided with DCT 100 on overload protection module 170. Circuit breakers are used to protect DCT 100 from excessive current and to detect short circuits in SCR modules to be tested. Circuit breakers on panel 170 include a main breaker 172, a 0.5 amp breaker 174 for the 48 volt direct current (VDC) supply, a 0.5 amp breaker 176 for the 24 VDC supply, a 0.5 amp breaker 178 for the 15 VDC supply, a 5 amp breaker 180 for the 120 VAC SCR input voltage SCRIN (A/D & E/F Bank A) or (E/F Bank B), and a 0.5 amp breaker 182 for SCR Trigger voltage.

Logic control module 130 provides circuitry to perform logic/control and automated test functions of DCT 100. Logic and control functions may be implemented using a variety of digital circuits, including, for example, discrete logic gates, a controller or processor, or programmable logic arrays, or a combination thereof. A user control panel 150 is equipped with switches to activate the various functions handled by control module 130. These include a main power switch 151, a number-of-cycles select switch 152 (selecting, for example, between a 1,000 or 10,000 cycle test), a voltmeter selector switch 153, an SCR Module select switch 154 (for example, F-A/18 A/D or F-A/18 E/F/G), a bank select switch 155 (pertains to E/F/G only), and a Run/Test switch 156.

DCT 100 also provides a display 160 that includes a waveform display 162 (for example, an oscilloscope), and a number of numerical counter displays. The waveform display 162 provides added confidence that the SCR module under test is operational. It enables a user to see the characteristic sine wave at a glance to ensure the unit under test is properly functioning. In this embodiment there are four counter/displays shown, a counter/display 164 (INTERROGATION), a counter/display 166 (CH 1 REPLY), a counter/display 168 (CH 2 REPLY), and a counter/display 170 (CH 3 REPLY). Individual displays/counters may be combined on one or more display devices and may be digital or analog depending on the needs of a particular embodiment. In alternative embodiments, a single display device may be used to display both waveforms and numerical test results.

Figure 4:
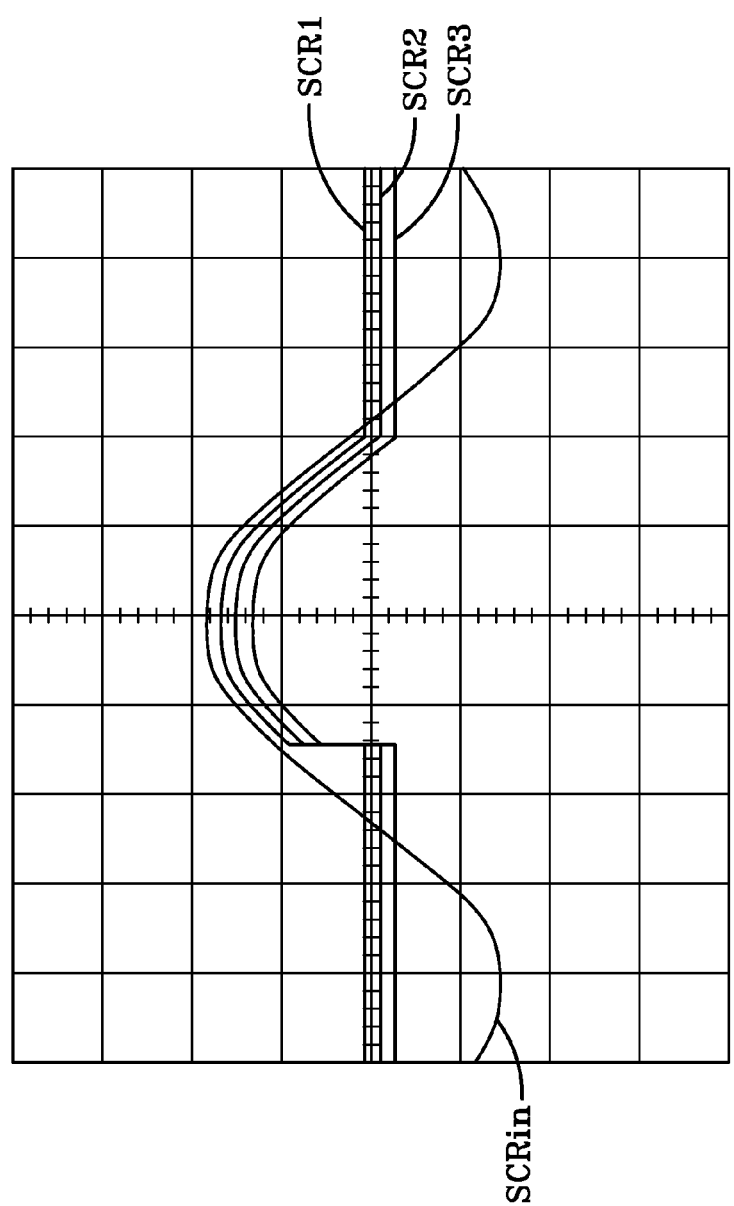
FIG. 4 shows input and output waveforms displayed in an embodiment of a DCT in accordance with the disclosed subject matter.

A number of test cycles are run to determine whether an SCR module may be defective. An example of the correct voltage waveforms observed on waveform display 162 over one test cycle is shown in FIG. 4. Voltage SCRIN is the input voltage and SCR1, SCR2, and SCR3, are the output voltage channels measured from test points on the respective SCR modules under test. In general, when the gate-to-cathode voltage of an SCR exceeds a certain threshold, a properly operating SCR will turn "on" and conducts current. The device will remain in the "on" state even after the gate current is removed so long as current through the anode to cathode current remains above the holding current. Once current falls below the holding current for an appropriate period of time, the device will switch "off." If the gate is pulsed and the current through the device is below the holding current, the device will remain in the "off" state. Basically, in order to test an SCR, it must be determined whether the SCR restricts current to normal leakage current when in the "off" state, responds appropriately to trigger signals and conducts as it should when in the "on" state.

DCT 100 tests 3 channels of an SCR simultaneously. Thus, an entire A/D module or one half of an E/F/G module may be tested at one time. A regular test takes roughly 35 seconds (for 1000 cycles) for a simultaneous test of three channels. An extended test of 10,000 Hz may alternatively be selected.

Figure 2:
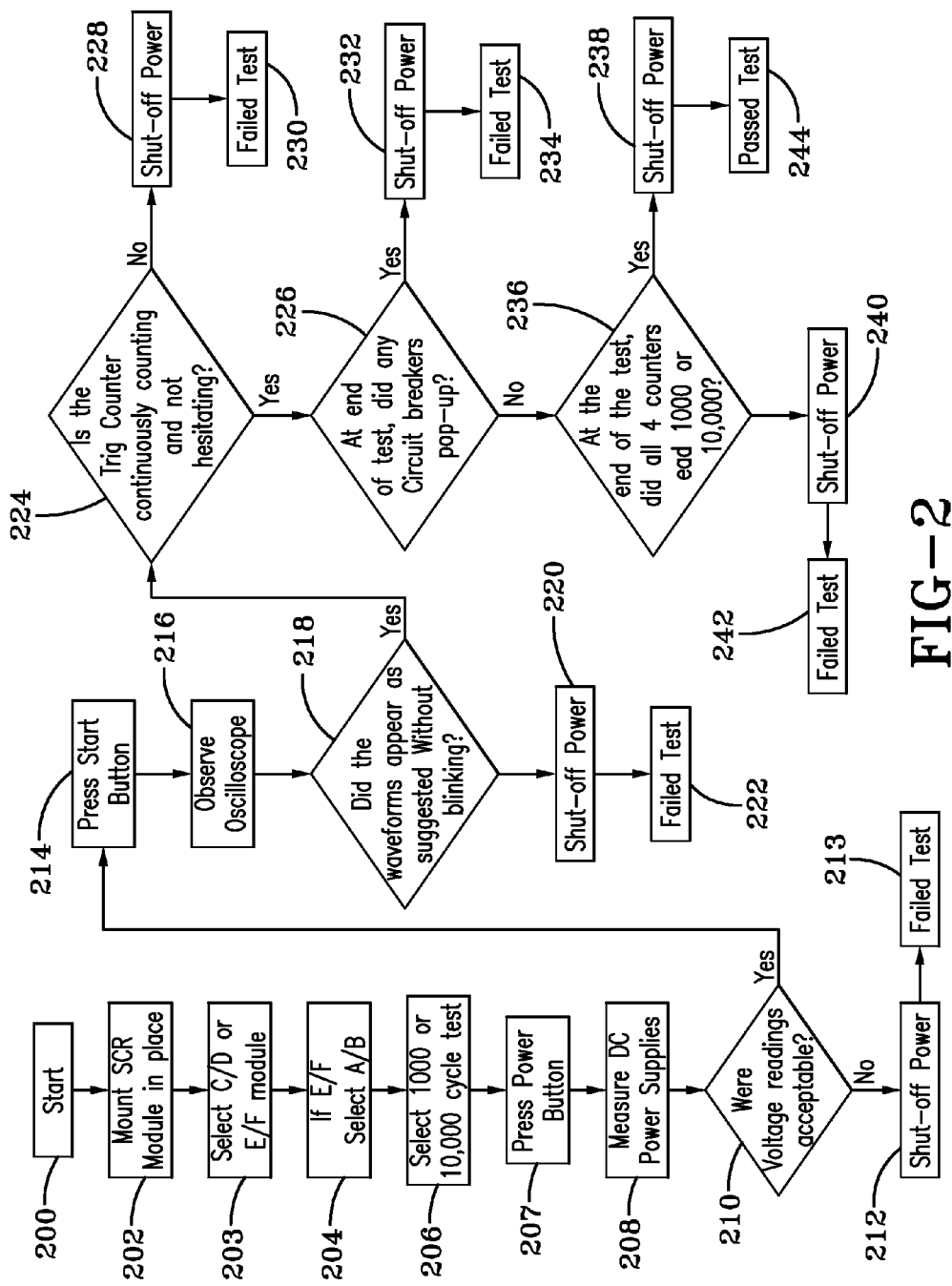
FIG. 2 shows a functional flow diagram of the operation of a Dynamic Counter Tester (DCT) in accordance with the disclosed subject matter.

Operation of DCT 100 is as follows. With reference to the Functional Flow Diagram shown in FIG. 2, following process step Start 200, at step 202 the user mounts an SCR 113, 115 to be tested in the appropriate clamp mechanism 310, 320 of quick clamp assembly 300. (To facilitate testing, both quick clamp mechanisms 310, 320 may be loaded with an SCR to be tested.) Proper insertion of the SCR and complete closure of quick clamp mechanism 310, 320 automatically switches the safety interlock devices 302 to enable the SCRIN test voltage to pass to the SCR(s) to be tested.

At step 203, the user selects which type SCR to test, A/D or E/F switch 154. If E/F was selected, step 204 requires selection of testing Bank A or B switch 155. Step 206 requires choice to run a regular test of 1,000 cycles (approximately 35 seconds) or an extended test of 10,000 cycles (approximately 5.5 minutes) switch 152. The user then depresses power button 151 and A DC voltage pre-check (step 208) ensures that control test voltages are within specification. Initially, 48VDC and 24VDC are provided to power each module under test.

If DC voltages are found to be acceptable (step 210), the user may press the Run Test switch 156 (step 214) to commence testing. If not, the user shuts off the power (step 212) and the unit fails the test (step 213).

After the Run Test switch 156 has been pressed, input voltage SCRIN is provided to the SCR module under test. The user observes the waveform display 162. SCRIN is nominally 120 VAC at 2.4 Amps. SCRIN and output waveforms SCR1, SCR2 and SCR3 will be displayed on waveform display screen 162. The waveform display screen 162 is optional and may not be included in all embodiments.

A/D Module Testing

Trigger signal pulses of +2 volts to −10 volts are delivered to each A/D SCR of the modules at trigger signal inputs P 1-7, P1-8 and P1-4 (not illustrated). For each cycle there are 9-11 (an average of 10) asynchronous trigger pulses. The trigger pulses commence soon after the zero crossing of the SCRIN input voltage. After a test cycle takes place there is a wait cycle. In other words, test cycles occur at every other cycle of the line voltage so there are less likely to be false readings. While 30 Hz is a convenient frequency to use and is effective in testing F-18 GCU SCR modules, in alternative embodiments, test cycles may be run more frequently, up to approximately 4,000 Hz. Counters 166, 168 and 170 register and display a count whenever an SCR channel has output a voltage. There are threshold detectors for counters 166, 168 and 170 of output voltages SCR1, SCR2 and SCR3, respectively, which are set at 60 volts or greater to avoid false counts. In addition the power supply and circuit breakers of DCT 100 have been sized for enhanced failure detection.

E/F Module Testing

Trigger signal pulses of +24 volts to 0 volts are delivered to each of six E/F SCR channels. E/F Bank A testing is very similar to A/D testing, and both test using the positive ½ wave of the SCR In input voltage with the trigger pulses J1-3, J1-4, and J1-5 (not illustrated) turning on soon after the zero crossing. For each cycle there are 9-11 (an average of 10) asynchronous trigger pulses (12 microsecond pulse width with 12 microseconds between pulses) Threshold detectors for counters 166, 168 and 170 of output voltages SCR1, SCR2 and SCR3, respectively, which are set at 60 volts or greater to avoid false counts, same as A/D.

E/F Bank B testing uses the negative ½ wave of the SCRIN input voltage with trigger pulses J1-7, J1-8, and J1-9 (not illustrated) turning on soon after zero crossing on a negative ½ wave of the SCR In input voltage. The trigger pulses are otherwise the same in appearance as the trigger pulses used on E/F Bank A. Threshold detectors for counters 166, 168 and 170 of output voltages SCR1, SCR2 and SCR3, respectively, are set at approximately −60 volts.

CONCLUSION

Although the present invention has been described in considerable detail with reference to certain embodiments hereof, it will be clear to one skilled in the art that the above embodiments may be altered in many ways without departing from the invention. Accordingly, the spirit and scope of the appended claims should not be limited to the description of the embodiments contained herein.

What is claimed is:

1. An apparatus for testing a silicon controlled rectifier module for a generator control unit, the silicon controlled rectifier module including a control power input, a gate input, a source power input and a load power output, the apparatus for testing the SCR comprising:

a power source interruptably connected to the power source input of the silicon controlled rectifier module to be tested;

a load interruptably connected to the load power output of the silicon controlled rectifier module to be tested;

a control voltage power source interruptably connected to the control voltage input of the silicon controlled rectifier module to be tested;

a test trigger voltage source interruptably connected to the silicon controlled rectifier module to be tested;

a quick clamp assembly for releasably securing the silicon controlled rectifier module, the quick clamp assembly comprising a plurality of probes for making multiple interruptible connections to the silicon controlled rectifier module;

a logic control module to perform logic/control and automated test functions for testing a silicon controlled rectifier module for a generator control unit;

a display to show the results of tests performed by the apparatus;

an overload protection module to prevent excess current from being drawn by the silicon controlled rectifier under test;

a safety interlock device that automatically prevents operator electrical shocks; and an enclosure containing the apparatus for testing the silicon controlled rectifier module for a generator control unit.

2. The apparatus according to claim 1 wherein the clamp assembly for securing the silicon controlled rectifier and making said interruptible test input power source connections is configured to connect to an SCR module for the generator control unit of an F-18 aircraft.

3. The apparatus according to claim 1 wherein the logic control module provides a plurality of test cycles each test cycle comprising delivering an input voltage to the SCR under test followed by a plurality of trigger signal pulses to the SCR gate input after a zero crossing of the input voltage.

4. The apparatus according to claim 3 wherein the input voltage to the SCR under test is a line voltage and the load current is about 2 amps to the SCR under test.

5. The apparatus according to claim 4 wherein test cycles occur at every other cycle of the line voltage.

6. The apparatus according to claim 5 wherein the display comprises counters that register a count when an SCR channel has output a voltage above a predetermined threshold.

7. The apparatus according to claim 1 wherein the quick clamp assembly comprises dual clamping mechanisms, a three channel clamp mechanism for releasably securing a three channel F-18 A/D SCR module, and a six channel clamp mechanism for releasably securing a 6 channel F-18 E/F/G SCR module.

8. The apparatus according to claim 5 wherein the display comprises a waveform display.

9. The apparatus according to claim 1 wherein the safety interlock device comprises a mechanical switch that automatically closes when the quick clamp assembly is in a clamped position.

* * * * *